United States Patent
Branch et al.

(10) Patent No.: US 7,003,230 B2
(45) Date of Patent: Feb. 21, 2006

(54) COUPLING MECHANISM FOR AN OPTICAL TRANSCEIVER HOUSING

(75) Inventors: Scott Michael Branch, Rochester, MN (US); Michael Francis Hanley, Rochester, MN (US)

(73) Assignee: JDS Uniphase Corporation, San Jose, CA (US)

( * ) Notice: Subject to any disclaimer, the term of this patent is extended or adjusted under 35 U.S.C. 154(b) by 657 days.

(21) Appl. No.: 10/015,024

(22) Filed: Dec. 11, 2001

(65) Prior Publication Data

US 2004/0207988 A1 Oct. 21, 2004

(51) Int. Cl.
*H04B 10/00* (2006.01)

(52) U.S. Cl. .................. 398/135; 398/136; 398/138; 398/163; 398/164; 385/88; 385/89; 385/90; 385/92; 385/93; 361/728; 361/704; 361/756; 361/759; 361/801; 361/802; 439/73

(58) Field of Classification Search ............ 398/22, 398/23, 24, 117, 121, 128, 130, 135, 152, 398/163, 164, 136, 138; 385/92, 88, 89, 385/90, 93; 359/152, 192, 754; 361/173, 361/174, 176, 177, 686, 683, 816, 728, 704, 361/756, 759, 801, 802; 292/114; 439/159, 439/352, 73
See application file for complete search history.

(56) References Cited

U.S. PATENT DOCUMENTS

| | | | | |
|---|---|---|---|---|
| 5,362,245 A | * | 11/1994 | Suguro et al. | 439/160 |
| 5,807,104 A | * | 9/1998 | Ikeya et al. | 439/73 |
| 5,879,173 A | * | 3/1999 | Poplawski et al. | 439/138 |
| 6,086,387 A | * | 7/2000 | Gallagher et al. | 439/71 |
| 6,213,806 B1 | * | 4/2001 | Choy | 439/331 |
| 6,325,552 B1 | * | 12/2001 | Brillhart | 385/88 |
| 6,556,811 B1 | * | 4/2003 | Sayers et al. | 455/90.3 |

* cited by examiner

*Primary Examiner*—Hanh Phan
(74) *Attorney, Agent, or Firm*—Allen, Dyer, Doppelt, Milbrath & Gilchrist, P.A.

(57) ABSTRACT

An optical transceiver providing a carrier; a cover couplable to a portion of the carrier to define a transceiver enclosure; and, an electro-optical assembly supported in the enclosure is provided. A coupling mechanism and cooperating structure are particularly adapted to define pivoting motion of the cover relative to the carrier, whereby interference of the cover and the electro-optical assembly is avoided. Methods of assembling the transceiver components are present.

18 Claims, 5 Drawing Sheets

COUPLING MECHANISM FOR AN OPTICAL
TRANSCEIVER HOUSING

BACKGROUND OF THE INVENTION

The present invention relates generally to a laser-based data communication interconnect apparatus for effecting optical data transfer and, more particularly, to a compact optical transceiver apparatus having an improved housing with an improved coupling mechanism and method of assembly.

Optical transceiver modules are known in the data transmission field for effecting bidirectional data transmission, whereby electrical signals are converted to optical signals and vice versa. In operation, a transmitter unit of the optical transceiver module functions to convert incoming electrical signals to corresponding optical signals. Conversely, incoming optical signals are converted by the optical transceiver module's receiving unit into corresponding electrical data signals. These units are typically mounted on a circuit host card that is normally associated with a host computer, input/output device, switch, or other peripheral device.

In general, transceiver module compactness for achieving space saving concerns is important particularly in situations wherein many optical transceiver modules are closely mounted on a data system for increasing port density. Such concerns become even more pronounced when it is desired to satisfy established as well as emerging standards relating to size and form factor. However, because these optical transceiver modules are relatively expensive to manufacture and relatively fragile in construction, it is important to avoid damaging them during the assembly process. Typically, during optical transceiver module assembly a heat sink cover is manually placed over and on a carrier base that supports a printed circuit board having expensive and compactly arranged electro-optical components of the optical transceiver module mounted thereon. Unless significant care is exercised in the assembly process due to the tight tolerances between such components as required by compactness constraints potential damage may occur. Further, there is a concern for being able to easily reopen and close the optical transceiver module for inspection and/or repair of the internal circuit board and the components carried thereon without damaging them. Moreover, there is a desire to not only make such transceivers easy to assemble, but to do so in a manner which does not compromise the integrity of effective electromagnetic interference (EMI) shielding.

Without the ability to effectively and efficiently assemble such optical transceiver modules, given the compactness constraints for meeting existing and emerging standards, by avoiding damage to their components, the potential value of providing low-cost and reliable optical transceivers is diminished.

Given the above, it will be appreciated, that there is a desire to provide for: optical transceiver modules that have compact constructions satisfying existing and emerging standards regarding size and form factor; optical transceiver modules wherein the assembly process can be carried out in a manner that reduces the likelihood of components being damaged; optical transceiver modules that are less costly to assemble; optical transceiver modules having the ability to protect interior components of the transceiver during repair and/or reconstruction; and, optical transceiver modules that achieve the foregoing without compromising desired EMI shielding.

SUMMARY OF THE INVENTION

It is, therefore, a principal aspect of the present invention to make provision for a compact optical transceiver module that has a relatively simple construction requiring few components for effecting ease of assembly and disassembly of the optical transceiver module.

It is, therefore, another principal aspect of the present invention to make provision for a compact optical transceiver module of the above type that minimizes the potential for damage to costly components of the optical transceiver module during assembly and/or disassembly thereof.

It is yet another aspect of the present invention to make provision for a compact optical transceiver module that has a relatively simple construction that facilitates safe and easy enclosing of expensive and fragile components requiring relatively compact space considerations during the assembly process.

It is, therefore, another principal aspect of the present invention to make provision for a compact optical transceiver module that is economical to manufacture and assemble.

It is, therefore, another principal aspect of the present invention to make provision for a compact optical transceiver module of the foregoing types that allow the optical transceiver module to meet existing and emerging standards as to size and form factor.

In regard to achieving the foregoing aspects, the present invention makes provisions for an optical transceiver that comprises: a carrier; a cover couplable to cooperating structure of a distal portion of the carrier to define a transceiver enclosure; an electro-optical assembly supported in the enclosure; and, a coupling mechanism coupled to the cooperating structure for allowing pivoting motion of the cover relative closed and opened conditions relative to the enclosure about a pivoting axis offset from the transceiver.

In an illustrated embodiment the coupling mechanism allows the cover to move to the closed condition without interference with upstanding components of the electro-optical assembly.

Further consistent with achieving the foregoing aspects and improving on the prior art the present invention makes provisions for the coupling mechanism allowing the cover to move to the closed condition without applying loading to upstanding components of the electro-optical assembly which might be sufficient to damage such components.

Further consistent with achieving the foregoing aspects, the present invention makes provisions for a method of assembling components of an optical transceiver. The method comprises the steps of: providing a carrier; providing a cover joinable together with the carrier to define an enclosure therebetween; providing an electro-optical subassembly within the enclosure and supported by the carrier; providing a coupling mechanism on one of the carrier or the cover; providing a cooperating structure on the other of the carrier and cover; and, assembling the cover to the carrier so that when the coupling mechanism is joined to the cooperating structure, the cover pivots in a controlled path between opened and closed conditions about an axis remote from the transceiver, whereby interference of the cover or the electro-optical assembly is substantially minimized or eliminated.

BRIEF DESCRIPTION OF THE DRAWINGS

For a more complete understanding of the present invention, reference is now made to the following detailed description of a preferred embodiment of the present invention illustrated in the accompanying drawings in which.

DETAILED DESCRIPTION

FIGS. 1–5 illustrate one preferred embodiment of an optical transceiver module 10 made according to the principles of the present invention and illustrated as being mounted in a host data transfer system 12.

Figure 1:
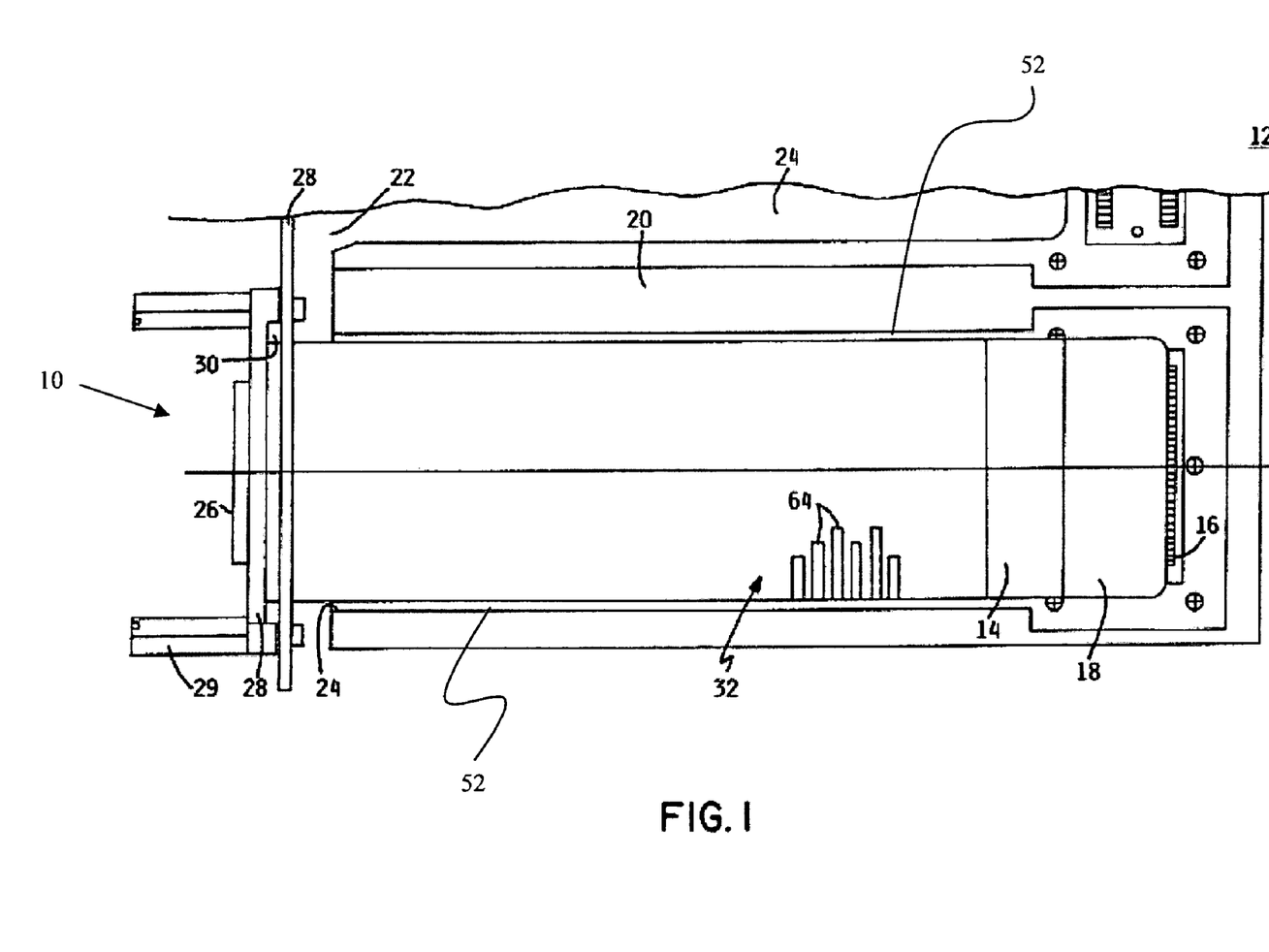
FIG. 1 is a schematic plan view of an optical transceiver of the present invention mounted on a host circuit card of a data transfer system of the present invention.

With reference to FIG. 1, a first or proximal end portion 14 of the optical transceiver module 10 is to be coupled directly to a card edge connector 16 that is covered in a metal shroud 18 and is otherwise connected to a network adapter card 20 housed within the confined space 22 formed by the host data transfer system 12. The host data transfer system 12 can be a mid-range computer system commercially available from International Business Machines Corporation, Armonk, N.Y. Other types of data transfer or communication systems are contemplated for use with the optical transceiver module 10 of the present invention, such as input/output devices or other peripheral devices. The optical transceiver module 10 is otherwise slideably received within one of a plurality of elongated slots 24 formed in the network adapter card 20 in a manner to be described. A suitable connector end portion 26 at the distal end of the optical transceiver module 10 is releasably coupled to a data transfer system bezel or wall 28 through threaded fastener members 29 attached to a flange after being inserted into a system access opening 30. The connector end portion 26 has ports (not shown). The connector end portion 26 is to be coupled to a suitable push-pull duplex "SC" connector (not shown) in a known manner. While a duplex "SC" type connection is envisioned, a comparable end portion cooperable with other known connectors, such as for example, a single "SC" connector, a "LC" connector, or a "MT-RJ" connector can be used.

Figure 2:
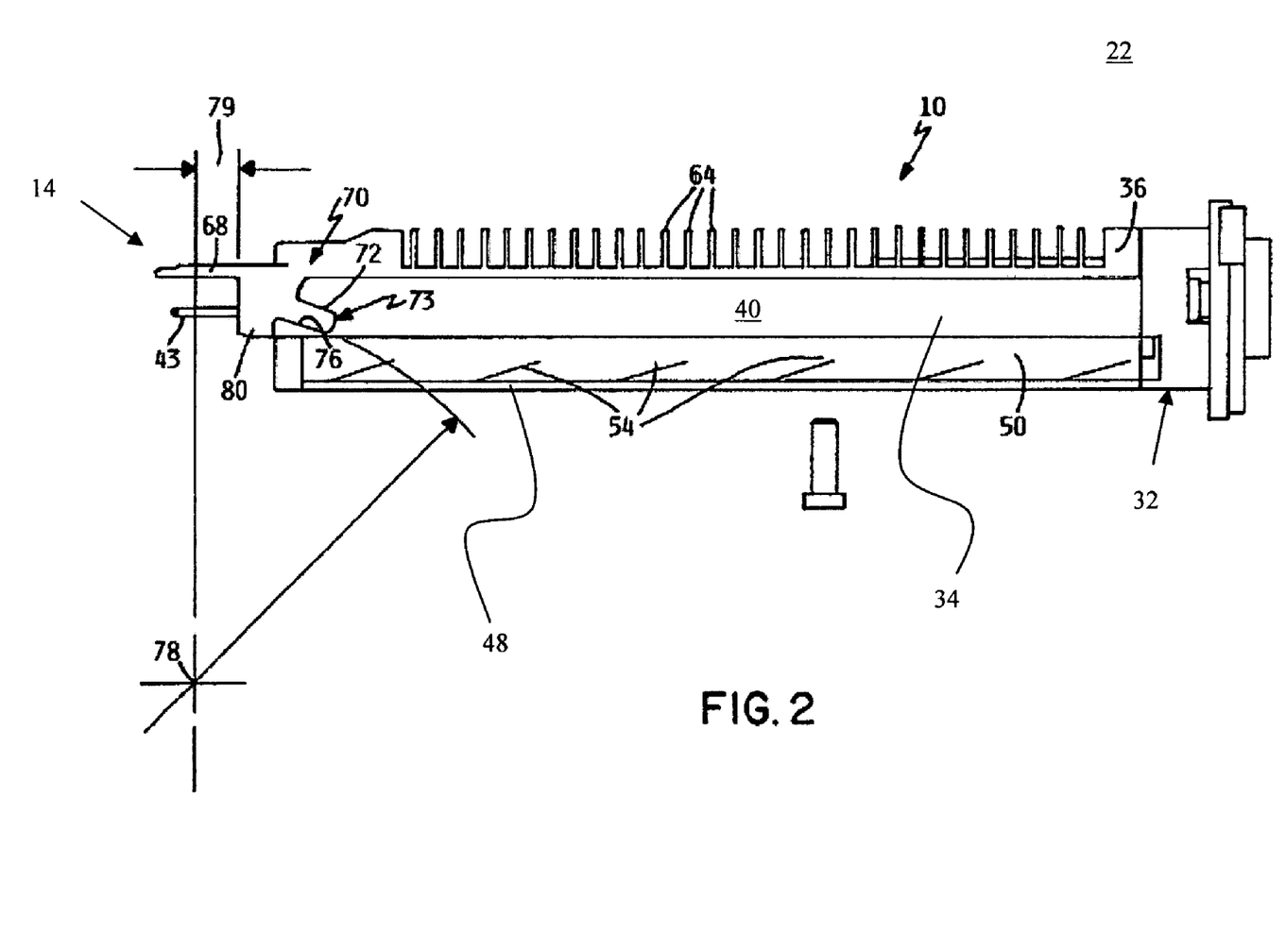
FIG. 2 is a schematic view of the optical transceiver in an assembled condition.
Figure 3:
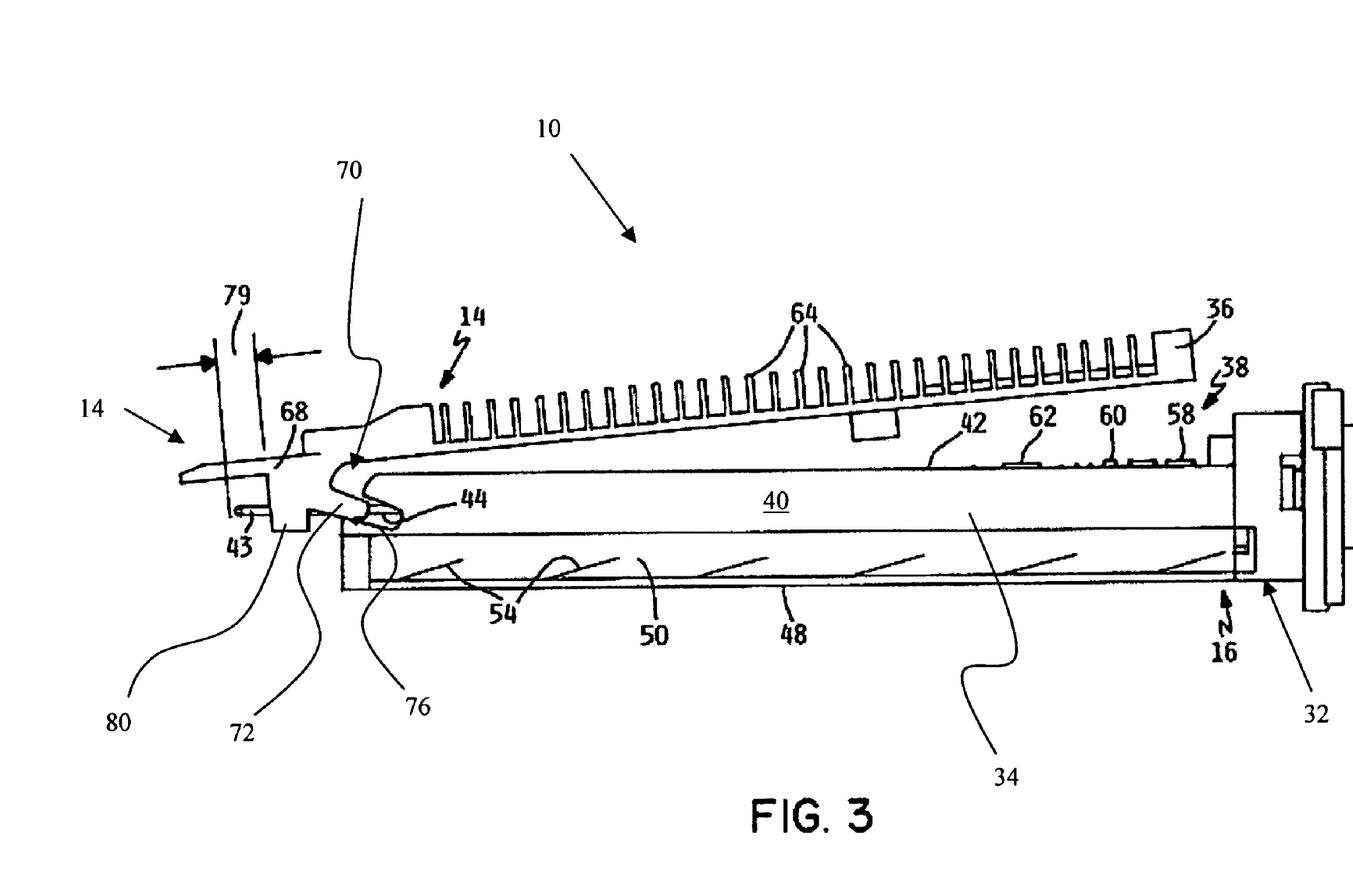
FIG. 3 is a schematic view similar to FIG. 2, but illustrating the transceiver partially in a disengaged/engaged position.
Figure 4:
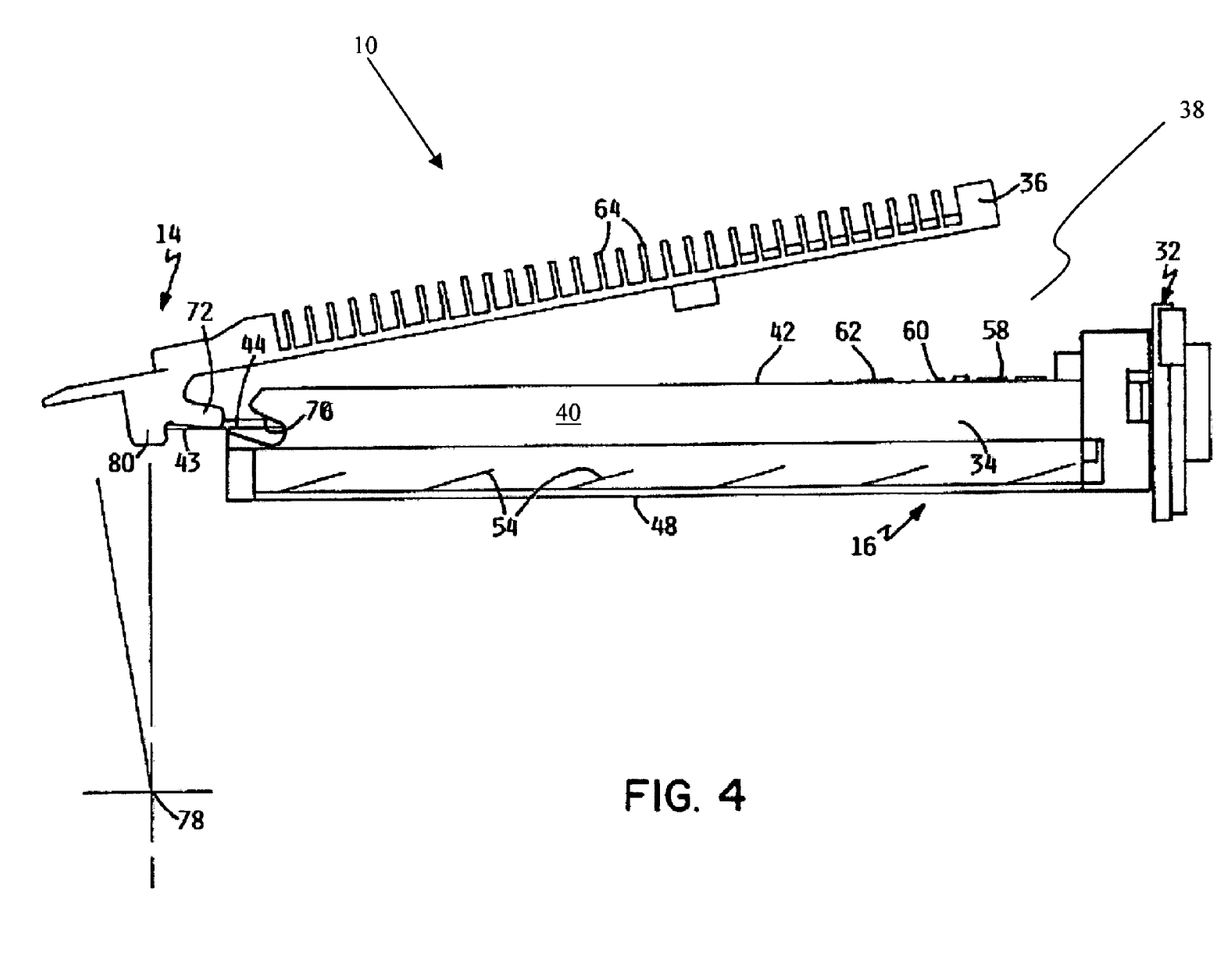
FIG. 4 is a schematic view similar to FIG. 3, but illustrating the heat sink cover removed from the carrier; and, FIG. 5 is an enlarged and fragmented perspective view of the coupling mechanism in the position depicted in FIG. 3.
Figure 5:
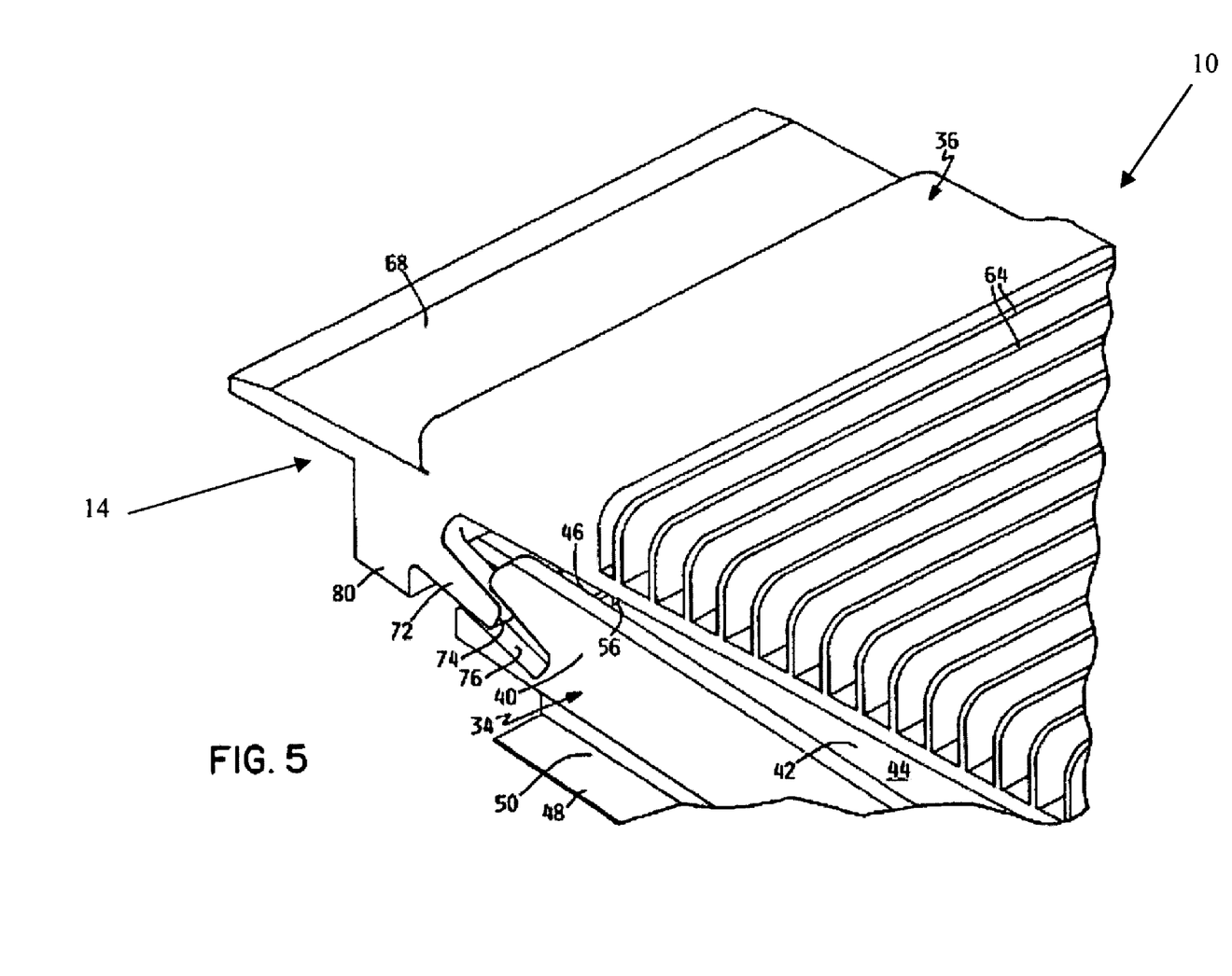

With reference to FIGS. 2 to 5, the optical transceiver module 10 comprises, a housing assembly 32 including a carrier member 34 being matable to a heat dissipating apparatus or heat sink cover or member 36; and, an electrooptical subassembly 38 that is substantially enclosed by and between the heat sink cover and carrier members 36 and 34, respectively. The carrier member 34 and heat sink cover 36 can be made from a variety of suitable materials that are selected to ensure generally uniform heat dissipation yet maintain effective electromagnetic interference (EMI) shielding. The carrier member 34 has, preferably, an integral parallelepiped construction and can be fabricated from any number of suitable materials that are generally used for optical transceivers. Ideally, the carrier member 34 is made of a low-cost, die-cast metal, such as aluminum or zinc, or a plastic with a metallized coating. An upstanding peripheral wall 40 surrounds and, in part, defines an enclosure 42 (FIGS. 3–5), which is a space between the carrier member 34 and the heat sink cover 36 for receiving the electro-optical assembly 38. The upper surface of the wall 40 engages a bottom wall of the heat sink cover member 36 to maintain effective EMI shielding. The wall 40 does not extend across the proximal end of the carrier member 34 and this allows an end portion 43 of a printed circuit board 44, forming a part of the electro-optical assembly 38, to protrude out of the optical trarsceiver module. A pair of spaced apart and generally parallel pedestals 46 (FIG. 5) is raised from the floor of carrier member 34 for purposes of providing a datum surface for the bottom surface of the heat sink cover 36. A pair of L-shaped card mounting members 48, only one of which is shown extends along each longitudinal mabginal edge of the optical transceiver module 10. Each of the mounting members 48 defines a corresponding guiding channel 50 that is adapted to receive edges 52 (FIG. 1) defining the slot 24. A row of longitudinally spaced apart spring members 54 is attached to a bottom surface of each of the mounting members 48. The spring members 54 serve to flexibly and resiliently bias the optical transceiver module 10 to the network adapter card 20 as well as permit bi-directional sliding motion of the optical transceiver module 10 to the network adapter card 20. As noted above, the printed circuit board member 44 is sized and configured to mount within the enclosure 42 and has the end portion 43 extended slightly from the housing assembly 32 as illustrated in FIGS. 2 to 4 for interconnection to the connector 16 (see FIG. 1). The printed circuit board 44 may comprise any suitable type of rigid or flexible type substrate. A known type of card edge connector, not shown, is at the end of the printed circuit board 44 so as to register with the connector 16 in a known manner. The printed circuit board member 44 is formed with a pair of generally parallel and spaced apart cutouts 56 (FIG. 5), each of which receives a respective one of the pedestals. As is known, this electrical connection is effective for interconnecting the electrooptical. assembly with the data transfer assembly.

Because of the heat generated due to operation of the electro-optical assembly 38, it is important to maximize heat transfer therefrom. For instance, the laser driver chip 58 tends to operate at relatively higher temperatures than some of the other components on the printed circuit board 44. One effective technique is to establish a thermal conductive path therefrom to the inside wall portion of the heat sink cover 36. While the laser driver chip 58 is shown in an upstanding relationship from the printed circuit board 44, it will be appreciated that other components have upstanding relationships, such as the known type of electro-optical transmitter subassembly (TOSA) unit 60 and an electro-optical receiver subassembly (ROSA) unit 62. Both the TOSA 60 and ROSA 62 are wired to the laser driver chip 58 mounted on the printed circuit board 44.

The heat sink cover 36 facilitates heat dissipation from operation of the electro-optical assembly 38. In this embodiment, the heat sink cover 36 is generally thin and rectangular in overall shape. A plurality of heat dissipating elements or fins 64 project upwardly from an external surface thereof; for purposes of clarity only a portion of the fins 64 are illustrated in FIG. 1, but are more completely illustrated in FIGS. 2–5. The fins 64 are deployed in a generally parallel and spaced apart relationship in the manner illustrated. The fins 64 are generally uniformly spaced apart relative to each other to allow air flow therebetween for an effective convective cooling relationship. Of course, the present invention contemplates that the fins 64 can have other configurations, spacings and heights. In fact, the fins 64 need not substantially cover the upper surface area of the heat sink cover 36. The proximal end of the heat sink cover 36 has a generally thin protective lip 68 extending over and beyond the protruding end portion 43 of the printed circuit board 44.

The present invention includes one preferred embodiment of a coupling mechanism 70 that comprises a pair of coupling arms, coupling elements 72 adjacent a distal end portion of the heat sink cover 36. Each of the coupling elements 72 is, preferably, formed integrally on opposing longitudinal edges of the heat sink cover 36 and is adapted to cooperate with cooperating structure 73 on a distal end of the carrier. A distal end portion 74 of each of the coupling elements 72 faces away and downwardly from the protective lip 68 for cooperation with corresponding elongated and curved slots 76 formed in sidewalls 40. The slots 76 also form part of the coupling mechanism 70. In this regard, each of the slightly curved slots 76 is sized and configured to allow for relative pivotal movement of the heat sink cover 36 with respect to the carrier member 34 when the coupling elements are inserted therein. Essentially, the slots 76 effect a camming action. The generally arcuate shape of the slots 76 effects a slight pivoting action of the heat sink cover 36 in a controlled path about a pivot axis 78 in response to the coupling elements 72 being inserted thereinto. Because of the camming provided by the slots 76 about the offset pivot axis 78 a controlled opening and closing motion of the heat sink cover 36 relative to the carrier member 34 and electro-optical assembly 38 is easily effected. This is accomplished with relatively substantially fewer components. Accordingly, the heat sink cover 36 is guided into the desired closed condition covering the enclosure 42 without imparting loading forces; especially lateral loading that might damage upstanding components of the electro-optical assembly 38. As a consequence, during assembly and/or disassembly of the heat sink cover 36 the potential of damage to such upstanding components is greatly diminished if not eliminated by the coupling mechanism 70 of the present invention. Also, the width of each of the slots 76 has a slightly tapered configuration thereby facilitating an even more secure interconnection with the complementary sized and shaped coupling elements 72. Such an interconnection minimizes compromise of EMI shielding integrity. In the broader context of the present invention, it will be appreciated that the coupling elements 72 could be on the carrier and the slots 76 provided in the heat sink cover 36.

It will be noted in FIG. 3 that the linear distance 79 the end portion 43 protrudes from the heat sink cover 36 is selected to be slightly less than the length of arcuate motion of the coupling elements 72 within each of the slots 76, in order to permit the heat sink cover 36 pivotal movement without interfering with the circuit board 44 while the heat sink cover 36 is being assembled or disassembled. In addition, the heat sink cover 36 has a pair of straddle members 80 straddling and engaging longitudinal marginal edges of the circuit board 44 and act to engage the carrier end for effecting stoppage of the motion of the coupling elements 72 relative to the slots 76 during assembly/disassembly. A tight locking engagement of the coupling elements 72 within the slots 76 is effected (FIG. 2) and as a result, effective maintenance of the EMI shielding is retained.

The embodiments and examples set forth herein were presented to best explain the present invention and its practical application and to thereby enable those skilled in the art to make and use the invention. However, those skilled in the art will recognize that the foregoing description and examples have been presented for the purpose of illustration and example only. The description set forth is not intended to be exhaustive or to limit the invention to the precise forms disclosed. Many modifications and variations are possible in light of the above teachings without departing from the spirit and scope of the appended claims.

What is claimed is:

1. An optical transceiver comprising:
   a carrier including a cooperating structure at a distal portion thereof;
   a cover including a coupling mechanism couplable to the cooperating structure of said carrier to define a transceiver enclosure; and
   an electro-optical assembly supported in said transceiver enclosure;
   wherein said coupling mechanism cooperates with said cooperating structure to enable pivoting motion in a controlled path of said cover relative to said carrier between closed and opened conditions relative to said transceiver enclosure about a pivoting axis offset from said transceiver;
   wherein said cooperating structure includes a pair of separate and laterally spaced apart coupling elements that project from said carrier; and
   wherein said coupling mechanism includes a pair of elongated slots, each of said slots is in corresponding separate and spaced apart walls of said cover, each of said slots being sized and shaped for camming corresponding ones of said coupling elements.

2. The transceiver of claim 1, wherein each of said coupling elements has a tapering configuration that is sized and shaped to be slidably received by said coupling mechanism for allowing the pivoting notion and to assist in a locking engagement of said cover and said carrier when said cover is in the closed condition.

3. The transceiver of claim 2 wherein said pair of coupling elements straddle and engage opposing longitudinal marginal edges of said electrooptical assembly.

4. An optical transceiver comprising:
   a carrier including a cooperating structure at a distal portion thereof;
   a separable cover including a coupling mechanism couplable to the cooperating structure to define a transceiver enclosure; and
   an electrooptical assembly supported in said transceiver enclosure;
   wherein said coupling mechanism is coupled to said cooperating structure for allowing pivoting motion in a controlled path of said cover between closed and opened conditions relative to said transceiver enclosure about a pivoting axis offset from said transceiver;
   wherein said coupling mechanism includes a pair of separate and laterally spaced apart coupling elements that project from said cover; and
   wherein each of said coupling elements has a tapering configuration that is sized and shaped to be slidably received by said cooperating structure for allowing the pivoting motion and to assist in a locking engagement of said cover and said carrier when said cover is in the closed condition.

5. The transceiver of claim 4 wherein said coupling mechanism cams said cover to move to the closed condition without interference with upstanding components of said electrooptical assembly.

6. The transceiver of claim 5 wherein said coupling mechanism positions that at least one of said upstanding components is in a thermally conductive heat transfer relationship to an interior surface of said cover when the latter is in the closed condition.

7. The transceiver of claim 4 wherein said coupling mechanism cams said cover to move to the closed condition without applying lateral loads to upstanding components of said electro-optical assembly which would be sufficient to force said components from their intended upright positions.

8. The transceiver of claim 4, wherein said cooperating structure includes a pair of elongated slots, each of said slots is in corresponding separate and spaced apart wall of said carrier, each of said slots being sized and shaped for camming corresponding ones of said coupling elements.

9. The transceiver of claim 8 wherein said cover and said carrier are made of a material that provides for EMI shielding.

10. The transceiver of claim 9 wherein said pair of coupling elements fit snugly within said slots so as to block said slots to provide for EMI shielding.

11. A data transfer system including a wall having an access opening and an adapter card assembly, in combination with an optical transceiver which is mounted to said wall access opening, said optical transceiver comprising:
a carrier;
a cover couplable to a portion of said carrier to define a transceiver enclosure;
an electro-optical assembly supported in the enclosure; and,
a coupling mechanism coupled to one of said carrier and said cover, said coupling mechanism cooperating with a cooperating structure on the other of said carrier and said cover for allowing pivoting motion in a controlled path of said cover relative to said carrier between closed and opened conditions relative to said enclosure about a pivoting axis offset from said transceiver;
wherein said coupling mechanism includes a pair of separate and laterally spaced apart coupling elements that project from said cover; and
wherein each of said coupling elements has a tapering configuration that is sized and shaped to be slidably received by said cooperating structure for allowing the pivoting motion and to assist in a locking engagement of said cover and said carrier when said cover is in the closed condition.

12. The system of claim 11, wherein said cooperating structure includes a pair of elongated slots, each of said slots is in corresponding separate and spaced apart walls of said carrier or said cover, each of said slots being sized and shaped for camming corresponding ones of said coupling elements.

13. The system of claim 12 wherein said pair of coupling elements straddle and engage opposing longitudinal marginal edges of said electro-optical assembly.

14. The system of claim 12 wherein said cover and said carrier are made of a material that provides for EMI shielding, such that said pair of coupling elements fit snugly within said slots so as to block said slots to provide for EMI shielding.

15. A data transfer system including a wall having an access opening and an adapter card assembly, in combination with an optical transceiver which is mounted to said wall access opening, said optical transceiver comprising:
a carrier including a cooperating structure;
a separable cover including a coupling mechanism couplable to the cooperating structure of said carrier to define a transceiver enclosure; and
an electrooptical assembly supported in said enclosure, said electro-optical assembly having a distal end protruding from said enclosure and being connectable to said adapter card assembly;
wherein the coupling mechanism is coupled to said cooperating structure for enabling pivoting motion of said cover between closed and opened conditions relative to said transceiver enclosure about a pivoting axis offset from said transceiver;
wherein said coupling mechanism includes a pair of separate and laterally spaced apart coupling elements that project from said cover; and
wherein said cooperating structure includes a pair of elongated slots, each of said slots is in corresponding separate and spaced apart wall of said carrier, each of said slots being sized and shaped for camming corresponding ones of said coupling elements.

16. The system of claim 15 wherein said coupling mechanism cams said cover to move to the closed condition without substantial interference with upstanding components of said electro-optical assembly.

17. The system of claim 16 wherein said coupling mechanism insures that at least one of said upstanding components is in a thermally conductive heat transfer relationship to an interior surface of said cover when the latter is in the closed condition.

18. The system of claim 15 wherein said coupling mechanism cams said cover to move to the closed condition without applying lateral loads to upstanding components of said electro-optical assembly that would be sufficient to damage said components.

* * * * *

UNITED STATES PATENT AND TRADEMARK OFFICE
CERTIFICATE OF CORRECTION

| | |
|---|---|
| PATENT NO. | : 7,003,230 B2 |
| APPLICATION NO. | : 10/015024 |
| DATED | : February 21, 2006 |
| INVENTOR(S) | : Branch et al. |

It is certified that error appears in the above-identified patent and that said Letters Patent is hereby corrected as shown below:

Col. 4, line 7, "optical trarsceiver" should read -- optical transceiver --

Col. 4, line 12, "longitudinal mabginal" should read -- longitudinal marginal --

Col. 4, line 35, "electrooptical" should read -- electro-optical --

Col. 6, line 29, "pivoting notion" should read -- pivoting motion --

Col. 6, line 34, "electrooptical" should read -- electro-optical --

Col. 6, line 60, "electrooptical" should read -- electro-optical --

Signed and Sealed this

Eighth Day of August, 2006

JON W. DUDAS
*Director of the United States Patent and Trademark Office*